(12) United States Patent
Mahdi et al.

(10) Patent No.: US 12,381,161 B2
(45) Date of Patent: Aug. 5, 2025

(54) BACKSIDE WAFER TREATMENTS TO REDUCE DISTORTIONS AND OVERLAY ERRORS DURING WAFER CHUCKING

(71) Applicant: Intel Corporation, Santa Clara, CA (US)

(72) Inventors: Tayseer Mahdi, Hillsboro, OR (US); Grant Kloster, Lake Oswego, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 17/957,552

(22) Filed: Sep. 30, 2022

(65) Prior Publication Data

US 2024/0113039 A1 Apr. 4, 2024

(51) Int. Cl.
*H01L 23/00* (2006.01)
*H01L 21/02* (2006.01)
*H01L 23/29* (2006.01)

(52) U.S. Cl.
CPC ...... *H01L 23/562* (2013.01); *H01L 21/02126* (2013.01); *H01L 21/0217* (2013.01); *H01L 23/291* (2013.01)

(58) Field of Classification Search
None
See application file for complete search history.

(56) References Cited

U.S. PATENT DOCUMENTS

| 6,864,192 | B1* | 3/2005 | Liou | G03F 7/0045 |
| | | | | 438/782 |
| 7,030,040 | B2* | 4/2006 | Goodner | H01L 21/76825 |
| | | | | 257/E21.259 |
| 2006/0275927 | A1* | 12/2006 | Dubin | B01J 19/0046 |
| | | | | 438/1 |
| 2012/0328875 | A1* | 12/2012 | Schoneveld | C09D 183/06 |
| | | | | 428/688 |
| 2015/0069354 | A1* | 3/2015 | Helander | H10K 50/81 |
| | | | | 174/126.1 |
| 2022/0362803 | A1* | 11/2022 | Hudson | H01L 21/76897 |

\* cited by examiner

*Primary Examiner* — Asok K Sarkar
(74) *Attorney, Agent, or Firm* — Essential Patents Group, LLP

(57) ABSTRACT

Methods, device structures, and wafer treatment chemistries related to backside wafer treatments to reduce distortions and overlay errors due to wafer deformation during wafer chucking are described. A backside layer is applied to the wafer prior to chucking. The chemistry of the backside layer lowers the surface free energy of the wafer during chucking to eliminate or mitigate wafer deformation during wafer processing.

25 Claims, 12 Drawing Sheets

BACKSIDE WAFER TREATMENTS TO REDUCE DISTORTIONS AND OVERLAY ERRORS DURING WAFER CHUCKING

BACKGROUND

In integrated circuit (IC) manufacturing, photolithography techniques are used to pattern thin films such as photoresist films over a substrate wafer. The patterned areas are then selectively protected during subsequent processing such as etch processing, material deposition, implantation, and so on. As feature sizes decrease in IC manufacturing, the combination of wafer shape and wafer chucking (e.g., attaching and securing a wafer to a chuck or wafer table during photolithography or other processing) cause significant in-plane distortions. Such distortions are a large fraction of the overall error in the photolithography processing. Similarly, in other processing operations, such as wafer to wafer bonding, accurate overlay is needed and can be impacted by wafer shape and wafer chucking.

To compensate for such errors, a variety of techniques are deployed. These include using models to predict in-plane distortion and subsequent correction during photolithography scanning, studying suitable positioning and orientation of the wafer during mounting to the chuck, actuated wafer tables that conform to the shape of the wafer during loading, and modifications to other operations in the wafer process flow such as using chemical vapor depositions that do not cause wafer warp and reactive ion etching that do not deteriorate overlay performance near the wafer edge. However, in-plane distortion prediction techniques are time consuming since not all wafers have the same shape and do not compensate for hot spots on the wafer, optimizing wafer positioning/orientation and actuated wafer tables are not likely to be sufficient solutions, and modifying other processing operations are time consuming and can cause other difficulties.

It is with respect to these and other considerations that the present improvements have been needed. Such improvements may become critical as the need to pattern ever small features sizes at ever tighter overlay budges are needed to fabricate advanced IC devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
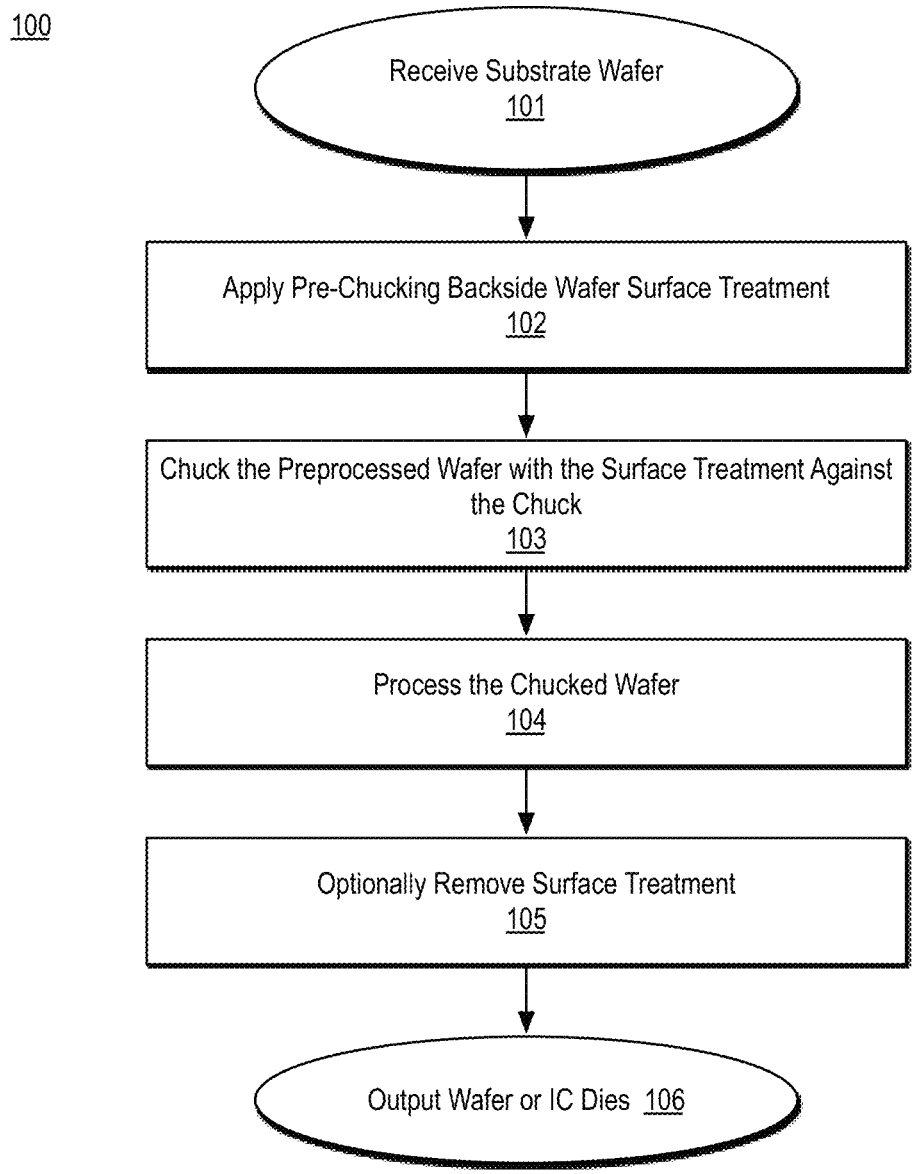
FIG. 1 is a flow diagram illustrating an example process for application of a backside wafer surface treatment to reduce wafer distortion during wafer chucking.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Methods, device structures, and wafer treatment chemistries are described herein related to backside wafer treatments to reduce distortions and overlay errors due to wafer deformation during chucking.

As discussed, it is desirable to reduce distortions and overlay errors due to wafer deformation during wafer chucking. Such distortion reduction is advantageous during wafer chucking or any wafer processing such as photolithography exposure (e.g., scanning) or others. Although discussed largely with respect to chucking for photolithography, the discussed backside wafer treatments may be deployed to reduce distortions during chucking for any wafer processing inclusive of wafer to wafer bonding. Notably, lowering the surface free energy of wafers through wafer backside deposition of molecules (monolayer or multilayer) may significantly reduce in-plane distortions. Such backside wafer treatments may match the surface energy to the wafer table allowing for the wafer to flatten on the wafer table to reduce overlay error from wafer geometry. Such backside wafer treatments may improve photolithography scanner overlay, wafer to wafer reproducibility, and extend wafer table lifetime. Such improvements may enable improved patterning for ever smaller features sizes and tighter overlay budges.

FIG. 1 is a flow diagram illustrating an example process 100 for application of a backside wafer surface treatment to reduce wafer distortion during wafer chucking, arranged in accordance with at least some implementations of the present disclosure. For example, process 100 may be implemented to fabricate integrated devices as illustrated herein. In the illustrated implementation, process 100 includes operations 101-106. However, embodiments herein may include additional operations, certain operations being omitted, or operations being performed out of the order provided.

Process 100 begins at operation 101, where a substrate wafer (e.g., work piece) such as a partially fabricated integrated circuit (IC) wafer is received for processing. The substrate wafer may include any suitable material or materials. For example, the substrate wafer may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In an embodiment, the substrate wafer includes a (111) crystalline group IV material. As discussed, the substrate wafer may include partially fabricated devices. For example, any suitable device structures such as transistors, capacitors, diodes, etc. may be fabricated in a device layer of the substrate wafer. Overlying metallization interconnect layers may then be formed over the device structures to interconnect the devices, and for eventual fabrication of IC dies that may be diced from the wafer. Notably, process 100 may be performed at or prior to any operation in the fabrication flow. As discussed, process 100 is particularly advantageous in the context of chucking prior photolithography to reduce distortions and overlay errors. However, process 100 may be performed in any suitable context such as wafer to wafer bonding, or others.

Processing continues at operation 102, where a backside wafer surface treatment is applied prior to chucking the wafer. The backside wafer surface treatment is applied to the wafer surface opposite the device layer and is deployed to reduce wafer distortions during chucking. For example, such backside wafer treatment may lower the surface free energy of wafers through the discussed wafer backside deposition of molecules (monolayer or multilayer) to advantageously reduce distortions such as in-plane distortions during wafer chucking.

Figure 2A:
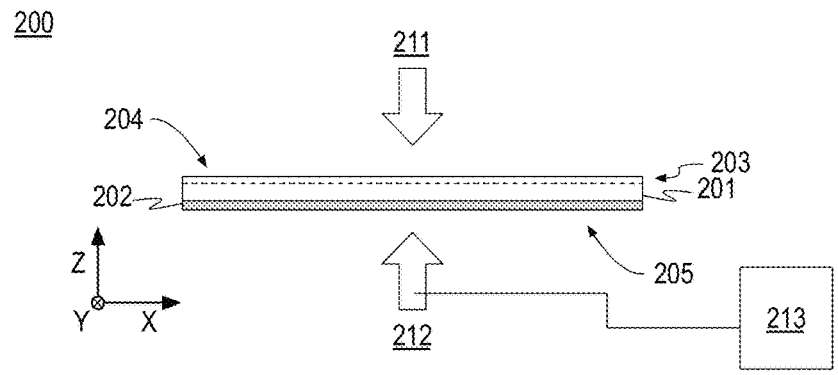
FIG. 2A illustrates a side view of a backside wafer surface treatment operation.

FIG. 2A illustrates a side view of a backside wafer surface treatment operation 200, arranged in accordance with at least some implementations of the present disclosure. As shown in FIG. 2A, a substrate wafer 201 includes a device layer 203 on or adjacent to a front surface 204 of substrate wafer 201. Substrate wafer 201 may include any materials discussed with respect to operation 101. Device layer 203 may include any suitable IC devices such as transistors, capacitors, diodes, and device layer 203 may include overlying metallization interconnect layers (e.g., metal via layers and metal line layers) to interconnect such devices. As shown, a backside wafer treatment layer 202 is applied over back surface 205 of substrate wafer 201. As used herein, the term front surface (or front side) of a substrate wafer indicates the build up side of such devices and metallization layers and the term back surface (or backside surface) indicates the opposite surface of the substrate wafer, in accordance with common usage in the art.

In the example of backside wafer surface treatment operation 200, backside wafer treatment layer 202 is applied using vapor delivery 212 during application of non-reactive gas 211. For example, non-reactive gas 211 may be nitrogen and may eliminate unwanted application of the backside wafer treatment to front surface 204. Backside wafer surface treatment 213, as discussed in detail below, is then vapor delivered under substrate wafer 201. In some embodiments, such vapor delivery 212 avoids the need of flipping substrate wafer 201 upside down during processing and then flipping back to the original orientation prior to chucking. In some embodiments, backside wafer surface treatment 213 is a liquid that is volatile, with high vapor pressure so it may be delivered to substrate wafer 201 using a vacuum at room temperature, or in some embodiments, heating.

Although illustrated with respect to backside wafer surface treatment operation 200, other backside application processes may be used such as spin coating techniques. In some embodiments, backside wafer surface treatment 213 may be deployed in a solvent such as an organic solvent with a lower vapor pressure. Exemplary solvents include toluene and propylene glycol methyl ether acetate (PGMEA), although others may be used. Furthermore, as discussed, in some embodiments, backside wafer surface treatment 213 is deployed without solvent.

Figure 2B:
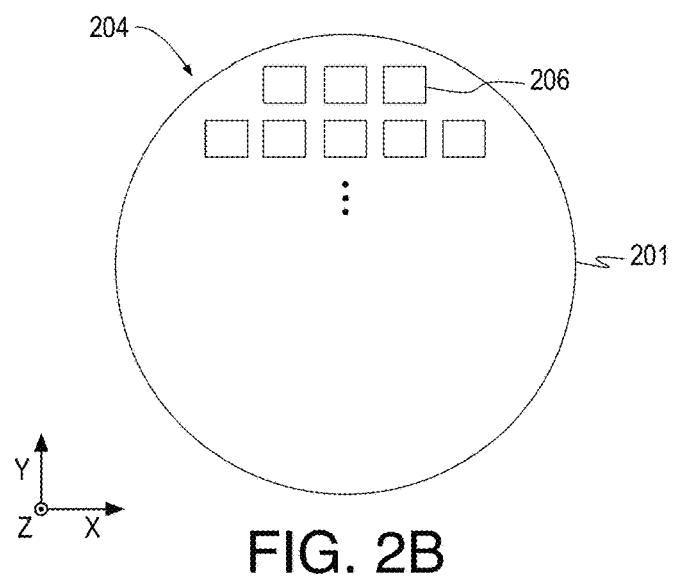
FIG. 2B illustrates a top-down view of a substrate wafer.

FIG. 2B illustrates a top-down view of substrate wafer 201, arranged in accordance with at least some implementations of the present disclosure. As shown in FIG. 2B, substrate wafer 201 includes individual in process IC dies 206 that are fabricated using the techniques discussed herein. Such IC dies 206, after fabrication, are then diced from substrate wafer 201 and packaged for deployment in an electronic device. In some embodiments, backside wafer treatment layer 202 remains during such fabrication and packaging, as discussed herein below.

Figure 2C:
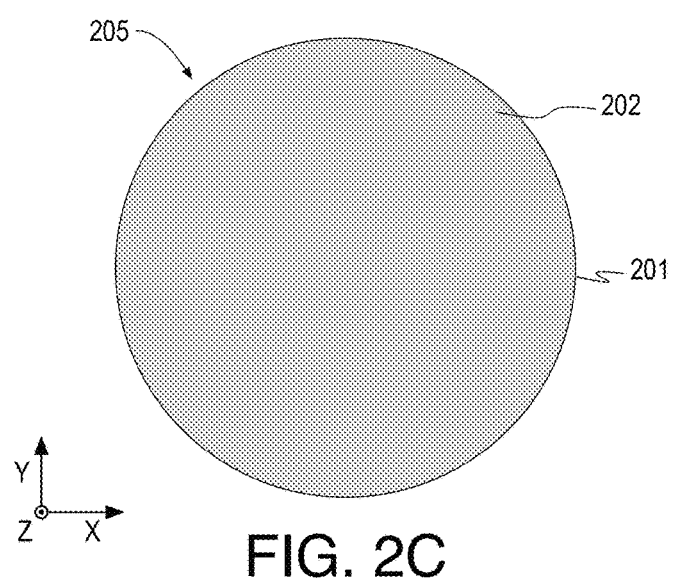
FIG. 2C illustrates a bottom-up view of a substrate wafer having a backside wafer treatment layer over an entirety of the back surface of the substrate wafer.

FIG. 2C illustrates a bottom-up view of substrate wafer 201 having a backside wafer treatment layer 202 over an entirety of the back surface of substrate wafer 201, arranged in accordance with at least some implementations of the present disclosure. As shown in FIG. 2C, in some embodiments, back surface 205 includes backside wafer treatment layer 202 over an entirety of (or neatly an entirety of) back surface 205. With reference to FIG. 2B, in such contexts each of IC dies 206 includes backside wafer treatment layer 202 over an entire back surface thereof. Such backside wafer treatment layer 202 over the entirety of back surface 205 may offer the advantage of simplicity of processing and the discussed distortion reduction.

In some embodiments, backside wafer treatment layer 202 is selectively applied on back surface 205. For example, it may be desirable to apply backside wafer treatment layer 202 only at particular locations corresponding to a chuck pattern or a backside wafer treatment layer 202 that further reduces distortion during chucking.

Figure 2D:
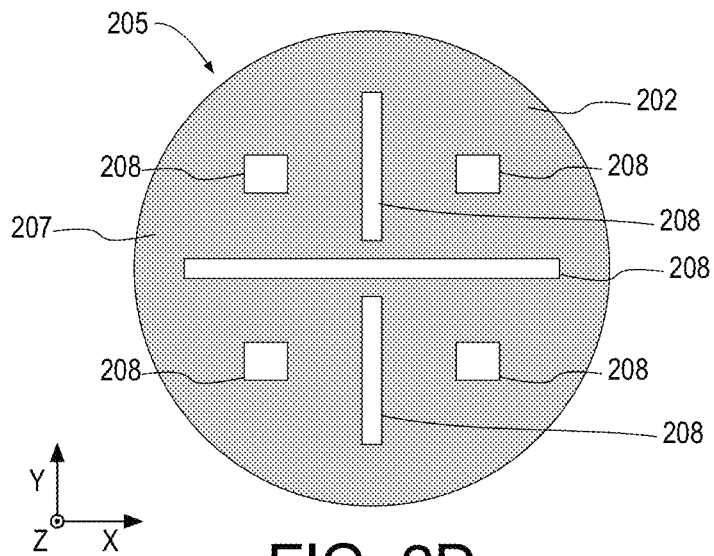
FIG. 2D illustrates a bottom-up view of a substrate wafer having a selective backside wafer treatment layer.

FIG. 2D illustrates a bottom-up view of substrate wafer 201 having a selective backside wafer treatment layer 202, arranged in accordance with at least some implementations of the present disclosure. As shown in FIG. 2D, in some embodiments, back surface 205 includes backside wafer treatment layer 202 on treatment regions 207 of back surface 205 while other non-treatment regions 208 are absent backside wafer treatment layer 202. Selective application of treatment regions 207 and non-treatment regions 208 may be provide an enhanced interface to chuck or wafer table having a particular pattern for reduced distortion.

Such selective backside wafer treatment layer 202 may be formed using any suitable technique or techniques. In some embodiments, a resist layer is patterned over back surface 205 to mask surface constituents that bond to backside wafer surface treatment 213, and backside wafer surface treatment 213 is then applied selective to the unmasked regions. For example, the patterned resist may correspond to the pattern of treatment regions 207 and non-treatment regions 208 with the patterned resist layer covering non-treatment regions 208 and openings in the patterned resist layer exposing treatment regions 207. Substrate wafer 201, with the patterned resist layer in place, is then processed as discussed with respect to backside wafer surface treatment operation 200 to selectively form treatment regions 207 (in the regions absent resist). As discussed, the patterned resist layer is then removed to provide selective backside wafer treatment layer 202. In other embodiments, a resist layer is applied to a treated wafer surface, and the resist is patterned. The patterned resist is then used as a mask to ash/etch the exposed regions and remove the backside treatment such that the areas under the unexposed resist are protected from the ash/etch, and the resist pattern is then removed. With reference to FIG. 2B, in such contexts, one or more of IC dies 206 includes backside wafer treatment layer 202 on a first region thereof and a second region absent backside wafer treatment layer 202.

Returning to FIG. 1, processing continues at operation 103, where the preprocessed wafer is chucked with the backside wafer surface treatment against the chuck. As used herein, the term chuck is used to indicate a wafer table, wafer stage, wafer plate, chuck plate, etc. on which a wafer is mounted during processing of the wafer. Similarly, the term chucking (or chucked) is used to indicate such mounting prior to and during processing. Therefore, the term chuck is inclusive of such wafer tables, wafer stages, wafer plates, chuck plates, and so on and the term chucking is inclusive of mounting a wafer, securing a wafer, and so on prior to and during processing. Such wafer chucks may be any suitable material such as aluminum, brass, bronze, chromium nitride, stainless steel, copper, ceramics, or glass.

As discussed, the backside wafer treatment layer applied at operation 101, either patterned or not, reduces wafer deformation during chucking and, in turn, reduces processing errors due to wafer deformation. Such processing errors include distortion and overlay errors in photolithography scanning, wafer to wafer distortion errors in wafer to wafer bonding, and others. Notably, any fabrication process that benefits from reduced wafer deformation during chucking may benefit from application of the backside wafer treatment layer prior to processing.

Figure 2E:
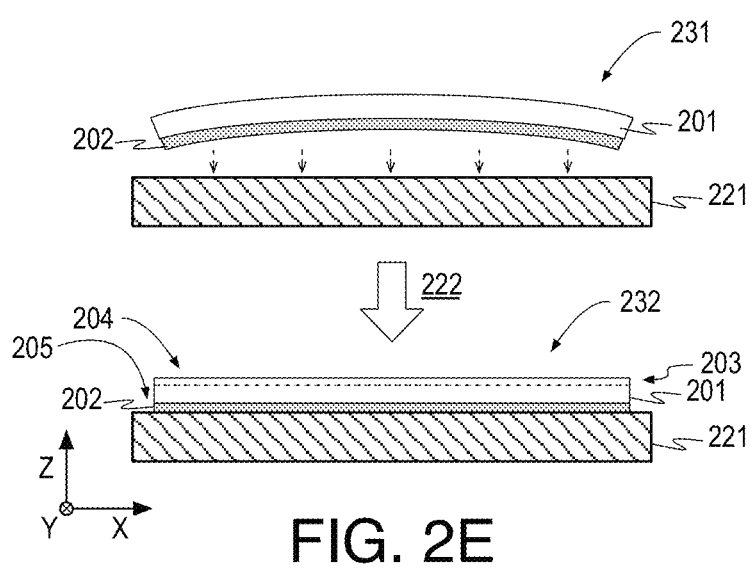
FIG. 2E illustrates a side view of a wafer chucking operation using a backside wafer treatment layer.

FIG. 2E illustrates a side view of a wafer chucking operation 222 using backside wafer treatment layer 202, arranged in accordance with at least some implementations of the present disclosure. As shown in FIG. 2E, substrate wafer 201 may have a warpage 231 (e.g., a deformation) as indicated by the curvature of substrate wafer 201. During wafer chucking operation 222 and subsequent processing, due to backside wafer treatment layer 202, substrate wafer 201 experiences less stress relative to substrate wafer 201 absent backside wafer treatment layer 202 when placed on and secured to chuck 221. Based on deployment of backside wafer treatment layer 202, substrate wafer 201 has less stress and therefore relaxes to a less deformed shape 232 on chuck 221.

Returning to FIG. 1, processing continues at operation 104, where the chucked wafer is processed in accordance with the fabrication operation being performed. The fabrication operation may be any suitable operation such as photolithography scanning. For example, the photolithography scanning may implement one of extreme ultraviolet lithography (EUV), deep ultraviolet lithography (DUV), or others. In some embodiments, the fabrication operation is wafer to wafer bonding. Although discussed with respect to photolithography and wafer to wafer bonding, other fabrication operations such as spin on processing, may benefit from the less deformed shape 232 afforded by implementation of backside wafer treatment layer 202.

Figure 2F:
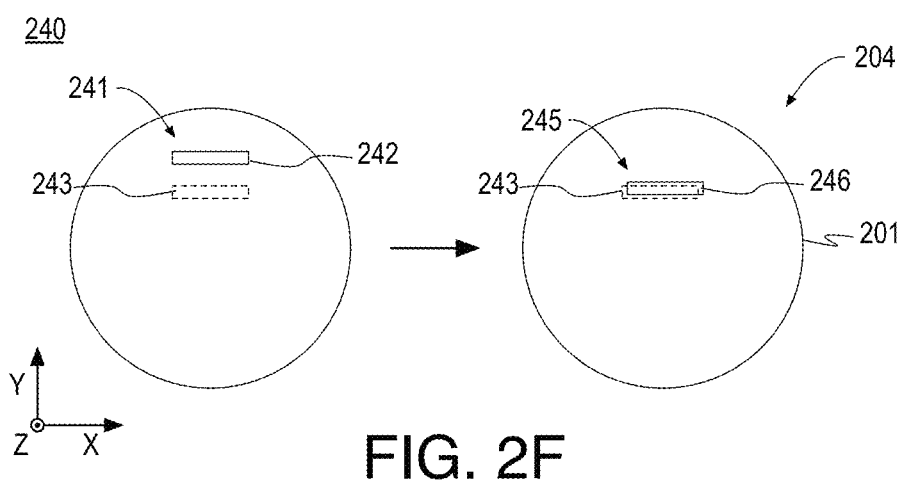
FIG. 2F illustrates a top-down view of improved overlay performance attained using a backside wafer treatment layer during photolithography scanning.

FIG. 2F illustrates a top-down view of improved overlay performance 240 attained using backside wafer treatment layer 202 during photolithography scanning, arranged in accordance with at least some implementations of the present disclosure. As shown in FIG. 2F, in contexts where backside wafer treatment layer 202 is not deployed, increased wafer deformation during photolithography scanning results in overlay error 241 represented by a location of printed feature 242 being offset with respect to a desired location 243 of printed feature 242. As shown with respect to reduced overlay error 245, when backside wafer treatment layer 202 is used, a location of printed feature 246 has a greatly reduced offset with respect to desired location 243. Such overlay error and distortion are greatly reduced when backside wafer treatment layer 202 is employed.

Returning to FIG. 1, processing continues at operation 105, where the backside wafer treatment layer may optionally be removed using any suitable technique or techniques such as chemical treatments, backside grind operations, photolytically, e-beam or the like. In some embodiments, the backside wafer treatment layer is removed after being used in fabrication processes (i.e., the wafer is chucked and processed at a first operation, removed, and subsequently chucked and processed at a second operation, and so on). In some embodiments, the backside wafer treatment layer is not removed Processing continues at operation 106, where a fabricated substrate wafer or IC dies diced from the substrate wafer as monolithic IC devices, as formed at least partially using operations 101-105 is output. The substrate wafer or monolithic integrated logic circuitry may be further processed and/or packaged in preparation for insertion in a final system or device. The monolithic integrated circuit formed via process 100 may be integrated into any suitable electronics device such as a tablet, a smart phone, a netbook, a laptop computer, a desktop computer, a server machine, and so on. An exemplary packaged device is illustrated herein with respect to FIG. 9.

Discussion now turns to exemplary backside wafer treatment layers 202 that may be deployed to reduce wafer distortions. Such chemicals may be used alone or in any combination to from backside wafer treatment layer 202. Furthermore, although illustrated with respect to particular head groups, terminating groups, and constituents, others may be deployed as discussed further herein. As used herein, the term head group indicates an atom or molecular group (e.g., group of atoms) that attach to a constituent of back surface 205 of substrate wafer 201. The term constituent indicates an atom or molecular group that a head group bonds to or an atom or molecular group that is used to form the bond. For example, a constituent (or a portion thereof) may be formed as a byproduct to the head group to back surface constituent bond. The term terminating group indicates a group that extends from a particular atom or molecular group and, as the name suggests, terminates the chain (i.e., no additional atoms or molecular groups are beyond the terminating group). The term molecular unit indicates a unit of a chain and includes a chain constituent (i.e., carbon, nitrogen, or oxygen) and, optionally, hydrogen bonded to each chain constituent. Such chains of molecular units may be branched, unbranched, saturated, or unsaturated, as discussed herein. Finally, the term chemical bond indicates a bond between atoms or molecular groups. Such chemical bonds may be ionic (e.g., a bond due to electrostatic attraction) or covalent (e.g., a bond consisting of the mutual sharing of one or more pairs of electrons between two atoms). In each of FIGS. 3 to 8, the FIG. first illustrates a wafer surface treatment molecule or molecules. The wafer surface treatment molecule may be applied to the substrate wafer (i.e., vaporized and contacted with the substrate wafer) and reacted with the back surface to attach to the substrate wafer surface. In each of FIGS. 3 to 8, the resultant bonded surface chemistry is then illustrated.

Figure 3:
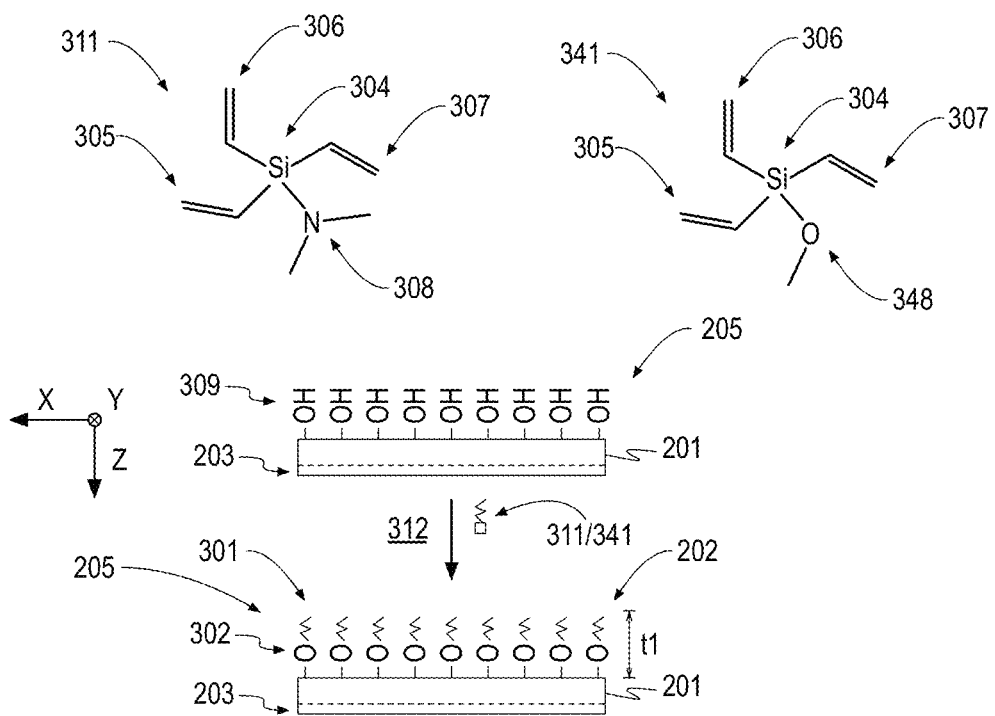
FIG. 3 illustrates an exemplary multi-vinyl terminating group backside wafer surface treatment chemistry molecular bonding to provide a backside wafer treatment layer.
Figure 3:
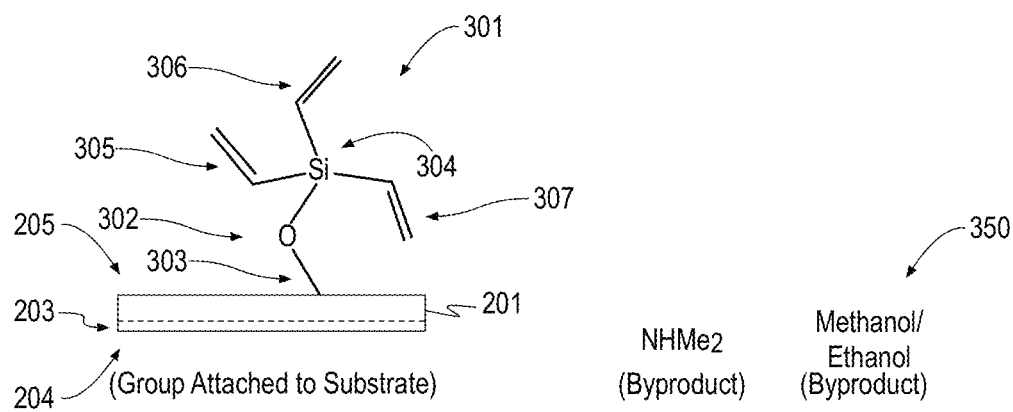

FIG. 3 illustrates an exemplary multi-vinyl terminating group backside wafer surface treatment chemistry molecular bonding 300 to provide backside wafer treatment layer 202, arranged in accordance with at least some implementations of the present disclosure. As shown in FIG. 3, a backside wafer surface treatment chemistry molecule 311 includes a head group 304 (e.g., a silicon atom) to bond to a backside wafer surface. Head group 304 is covalently bonded to a constituent group 308. In the example of backside wafer surface treatment chemistry molecule 311, constituent group 308 is a dimethylamine group including a nitrogen atom bonded to head group 304 (e.g., by a silicon to nitrogen bond) and two methyl groups bonded to the nitrogen atom. Alternatively, a backside wafer surface treatment chemistry molecule 341 includes head group 304 covalently bonded to a constituent group 348. In the example of backside wafer surface treatment chemistry molecule 341, constituent group 348 is a methoxy group including an oxygen atom bonded to head group 304 (e.g., by a silicon to oxygen bond) and a methyl group bonded to the oxygen atom. Alternatively, constituent group 348 may be an ethoxy group including an oxygen atom bonded to head group 304 (e.g., by a silicon to oxygen bond) and an ethyl group bonded to the oxygen atom. In any case, the bond between head group 304 and constituent group 308, 348 is easily cleaved to expose head group 304 during backside wafer surface treatment.

Backside wafer surface treatment chemistry molecules 311, 341 further include three terminating groups 305, 306, 307 covalently bonded to head group 304. In the illustrated example, each of terminating groups 305, 306, 307 is a vinyl group covalently bonded to head group 304 by a carbon to silicon bond. A vinyl group, as shown, includes the first carbon atom bonded to head group 304, a second carbon atom double bonded to the first carbon atom, and corresponding hydrogen atoms (i.e., vinyl group, R—CH=CH2, with R in this case being the silicon atom). In some embodiments, as shown, backside wafer surface treatment chemistry molecule 311 is 1,1,1-Triethenyl-N,N-dimethylsilanamine.

Although illustrated with respect to three vinyl terminating groups 305, 306, 307, backside wafer surface treatment chemistry molecule 311 may include other terminating groups. In some embodiments, backside wafer surface treatment chemistry molecule 311 has a single vinyl terminating group and the other terminating groups are selected from one of a methyl group, a phenyl group, a group having a chain of three to ten molecular units, or others. Herein, a a group having a chain of three to ten molecular units may have molecular units including one or more of carbon, hydrogen, nitrogen, or oxygen. In some embodiments, backside wafer surface treatment chemistry molecule 311 has two vinyl terminating group and the other terminating group is selected from one of a methyl group, a phenyl group, a group having a chain of three to ten molecular units, or others. As discussed, each molecular unit includes a chain constituent such as carbon, nitrogen, or oxygen. Such chains may be branched, unbranched, saturated, or unsaturated. An unbranched chain consists of a single chain of chain constituent (e.g., a single carbon chain with only hydrogen bonded thereto). In a branched chain, a constituent group (e.g., methyl group, ethyl group, etc.) is attached to one or more of the chain constituent. A saturated chain contains only single bonds between adjacent chain constituents such as carbon and unsaturated chains include one or more double bonds between adjacent chain constituents such as carbon.

As shown with respect to bonding operation 312, backside wafer surface treatment chemistry molecule 311 and/or backside wafer surface treatment chemistry molecule 341 are exposed to back surface 205 of substrate wafer 201. In some embodiments, back surface 205 of substrate wafer 201 has exposed hydroxyl groups 309. Although illustrated with respect to silicon head groups 304 bonding to oxygen atoms of exposed hydroxyl groups 309, other head group to exposed constituent chemistries may be used to accommodate coupling backside wafer surface treatment chemistry molecule 311, 341 to exposed metals, metal oxides, or interlayer dielectric materials of back surface 205 of substrate wafer 201.

During back surface exposure during bonding operation 312, the bond between head group 304 and constituent group 308, 348 is cleaved and head group 304 bonds to the oxygen constituent 302 of back surface 205 (and bonded thereto by bond 303) of substrate wafer 201 to form backside wafer treatment layer 202. In the example of FIG. 3, backside wafer treatment layer 202 is a monolayer having a thickness t1 in the range of about 1 to 2 nm, for example. In some embodiments, thickness t1 is not more than 5 nm. In some embodiments, thickness t1 is not more than 3 nm. In some embodiments, thickness t1 is not more than 2 nm.

As shown in the close up view toward the bottom of FIG. 3, molecules 301 are attached to back surface 205 of substrate wafer 201. In some embodiments, an IC device includes device layer 203 adjacent to front surface 204 of IC die 206, and backside wafer treatment layer 202 on back surface 205 such that backside wafer treatment layer 202 includes molecule 301 chemically bonded to constituent 302 of back surface 205. In some embodiments, molecule 301 includes head group 304 chemically bonded to constituent 302 (e.g., by an oxygen to silicon bond), and a number of terminating groups 305, 306, 307 covalently bonded to head group 304. In the example of FIG. 3, one or more of terminating groups 305, 306, 307 includes a vinyl group. As shown, bonding of backside wafer surface treatment chemistry molecule 311, 341 to form molecule 301 provides a byproduct 350, which in this example is dimethylamine (when backside wafer surface treatment chemistry molecule 311 is used) or methanol or ethanol (when backside wafer surface treatment chemistry molecule 341).

Figure 4:
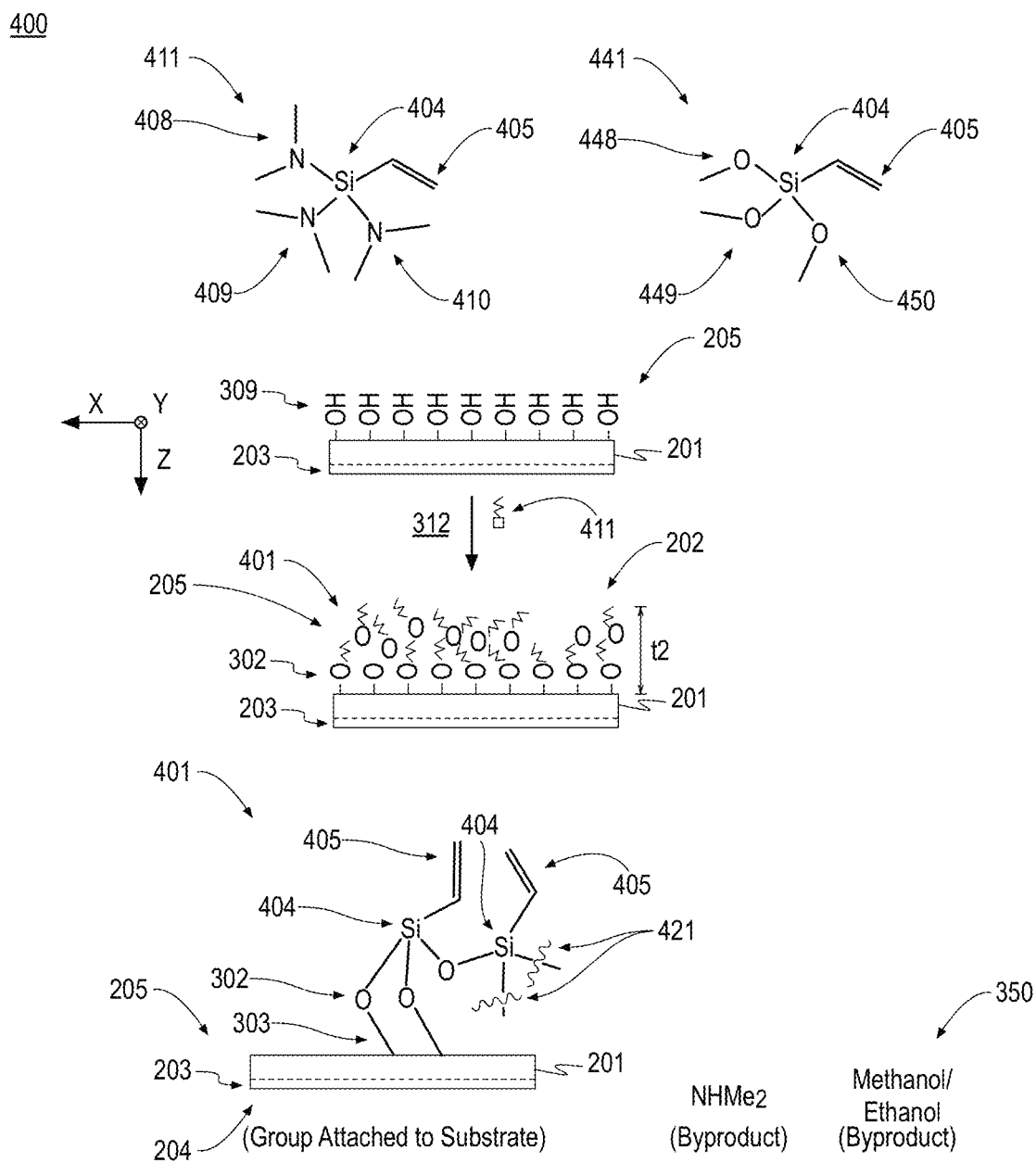
FIG. 4 illustrates an exemplary vinyl terminating group backside wafer surface treatment chemistry molecular bonding to provide a multi-layer backside wafer treatment layer.

FIG. 4 illustrates an exemplary vinyl terminating group backside wafer surface treatment chemistry molecular bonding 400 to provide a multi-layer backside wafer treatment layer 202, arranged in accordance with at least some implementations of the present disclosure. As shown, a backside wafer surface treatment chemistry molecule 411 includes a head group 404 (e.g., a silicon atom) to bond to a backside wafer surface. Head group 404 is covalently bonded to multiple constituent groups 408, 409, 410. In some embodiments, each constituent group 408, 409, 410 is a dimethylamine group including a nitrogen atom bonded to head group 304 (e.g., by a silicon to nitrogen bond) and two methyl groups bonded to the nitrogen atom. Backside wafer surface treatment chemistry molecule 411 further includes a terminating group 405 covalently bonded to head group 404. In some embodiments, terminating group 404 is a vinyl group covalently bonded to head group 404 by a carbon to silicon bond. In some embodiments, as shown, backside wafer surface treatment chemistry molecule 411 is Tris(N, N-dimethylamino)vinyl silane. Alternatively, a backside wafer surface treatment chemistry molecule 441 includes head group 404 covalently bonded to constituent groups 448, 449, 450. In the example of backside wafer surface treatment chemistry molecule 441, constituent groups 448, 449, 450 are methoxy groups although one or more of constituent groups 448, 449, 450 may be ethoxy groups.

Although illustrated with respect to one vinyl terminating group 405 and three constituent groups 408, 409, 410, 448, 449, 450 backside wafer surface treatment chemistry molecule 411 may include two vinyl terminating groups and two dimethylamine or methoxy/ethoxy constituent groups or three vinyl terminating groups and one dimethylamine or methoxy/ethoxy constituent group. In some embodiments, vinyl terminating group 405 is replaced with a group having a chain of three to ten molecular units, as discussed herein. As shown with respect to bonding operation 312, backside wafer surface treatment chemistry molecules 411 or backside wafer surface treatment chemistry molecules 441 are exposed to back surface 205 of substrate wafer 201. In some embodiments, back surface 205 of substrate wafer 201 has exposed hydroxyl groups 309. Although illustrated with respect to silicon head groups 404 bonding to oxygen atoms of exposed hydroxyl groups 309, other head group to exposed constituent chemistries may be used to accommodate coupling backside wafer surface treatment chemistry molecule 411, 441 to exposed metals, metal oxides, or interlayer dielectric materials of back surface 205 of substrate wafer 201.

During back surface exposure during bonding operation 312, the bond between head group 404 and one or more of constituent groups 408, 409, 410 or one or more of constituent groups 448, 449, 450 is cleaved and head group 404 bonds to the oxygen of exposed hydroxyl groups 309. Head group 404 may bond to a single oxygen atoms or to two or three oxygen atoms of back surface 205 (with two being illustrated). Furthermore, oxygen atoms in the reaction environment may bond to head group and cross link to other backside wafer surface treatment chemistry molecules 411, 441 as shown with respect to cross links 421. Such cross linking is effectively self terminating to form a limited multilayer having thickness t2. In the example of FIG. 4, backside wafer treatment layer 202 is a multilayer having a thickness t2 in the range of about 3 to 4 nm, for example. In some embodiments, thickness t2 is not more than 5 nm. In some embodiments, thickness t2 is not more than 4 nm. In some embodiments, thickness t2 is not less than 2 nm. In some embodiments, thickness t2 is not less than 3 nm.

As shown in the close up view toward the bottom of FIG. 4, molecules 401 are attached to back surface 205 of substrate wafer 201. In some embodiments, an IC device includes device layer 203 adjacent to front surface 204 of IC die 206, and backside wafer treatment layer 202 on back surface 205 such that backside wafer treatment layer 202 includes molecule 401 chemically bonded to constituent 302 of back surface 205. In some embodiments, molecules 401 include head group 404 chemically bonded to constituent 302 (e.g., by an oxygen to silicon bond), and a terminating group 405 covalently bonded to head group 404. In the example of FIG. 4, terminating group 405 is a vinyl group. In other embodiments, terminating group 405 is a group having a chain of three to ten molecular units. As shown, bonding of backside wafer surface treatment chemistry molecule 411 to form molecules 401 provides a byproduct 350.

Figure 5:
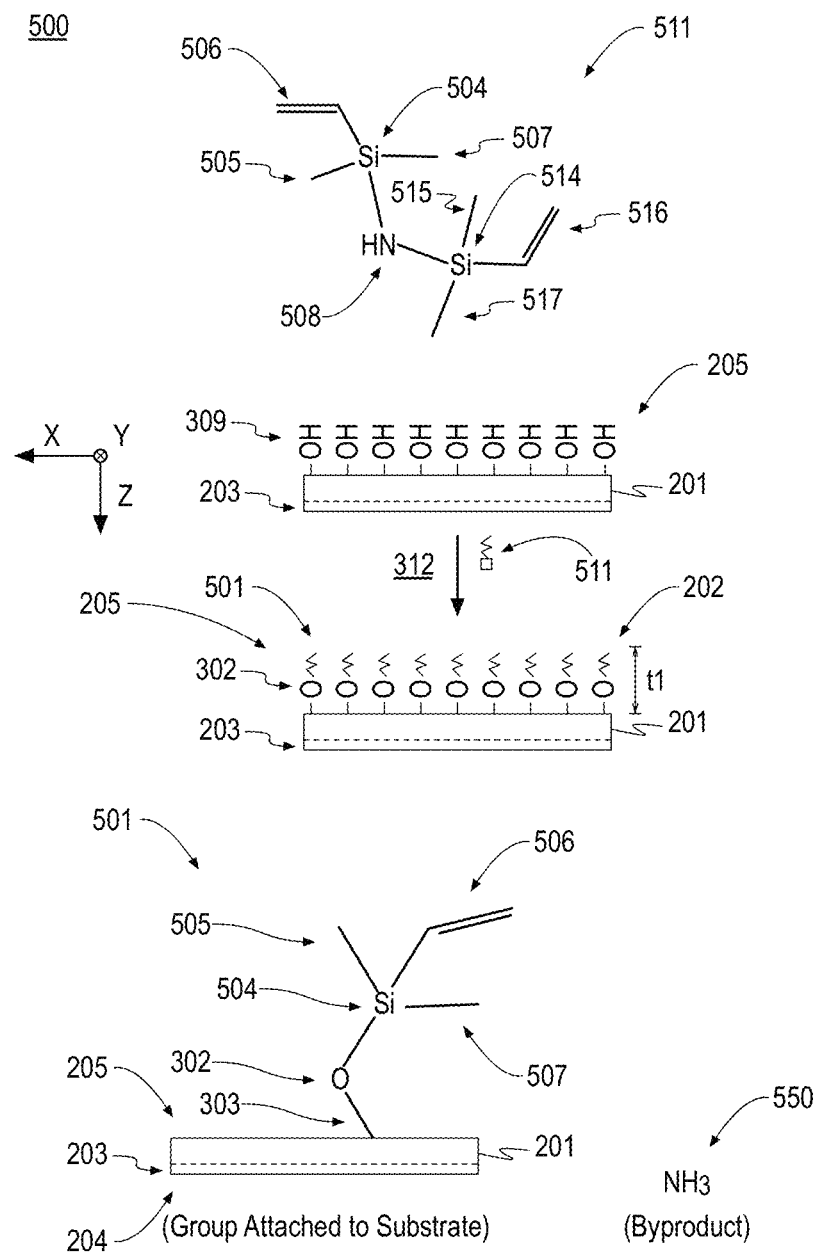
FIG. 5 illustrates an exemplary multi-head group multi-vinyl terminating group backside wafer surface treatment chemistry molecular bonding to provide a backside wafer treatment layer.

FIG. 5 illustrates an exemplary multi-head group multi-vinyl terminating group backside wafer surface treatment chemistry molecular bonding 500 to provide backside wafer treatment layer 202, arranged in accordance with at least some implementations of the present disclosure. As shown in FIG. 5, a backside wafer surface treatment chemistry molecule 511 includes a head group 504 (e.g., a silicon atom) and a head group 514 (e.g., a silicon atom), to bond to a backside wafer surface. As shown, head groups 504, 514 are each covalently bonded to a nitrogen atom of constituent group 508. Furthermore, head group 504 is covalently bonded to terminating groups 505, 506, 507 and head group 514 is covalently bonded to terminating groups 515, 516, 517. In the example of FIG. 5, the bonds between head groups 504, 514 and constituent group 508 are easily cleaved to expose head groups 504, 514 during backside wafer surface treatment. Although illustrated with respect to head groups 504, 514 being bonded by a nitrogen atom, in some embodiments, groups 504, 514 are bonded by an oxygen atom.

As discussed, backside wafer surface treatment chemistry molecule 511 further includes three terminating groups 505, 506, 507 covalently bonded to head group 504 and three terminating groups 515, 516, 517 covalently bonded to head group 514. In the illustrated example, terminating groups 506, 516 are vinyl groups covalently bonded to head groups 504, 514, respectively, by carbon to silicon bonds, and terminating groups 505, 507, 515, 517 are methyl groups covalently bonded to head groups 504, 514, respectively, by carbon to silicon bonds. For example, in some embodiments, backside wafer surface treatment chemistry molecule 511 is 1,3-divinyl-1,1,3,3-tetramethyldisilazane. In other embodiments, each of terminating groups 505, 506, 507, 515, 516, 517 are vinyl groups. In other embodiments, each of terminating groups 505, 506, 507, 515, 516, 517 are methyl groups. In yet other embodiments, each of terminating groups 505, 506, 507, 515, 516, 517 are phenyl groups. In some embodiments, one or more of terminating groups 505, 506, 507, 515, 516, 517 are a group having a chain of three to ten molecular units. In some embodiments, terminating groups 505, 506, 507 include one each of a vinyl group, a methyl group, and a phenyl group and/or terminating groups 515, 516, 517 include one each of a vinyl group, a methyl group, and a phenyl group. Other combinations are available.

As shown with respect to bonding operation 312, backside wafer surface treatment chemistry molecules 511 are exposed to back surface 205 of substrate wafer 201. In some embodiments, back surface 205 of substrate wafer 201 has exposed hydroxyl groups 309. Although illustrated with respect to silicon head groups 304 bonding to oxygen atoms of exposed hydroxyl groups 309, other head group to exposed constituent chemistries may be used to accommodate coupling backside wafer surface treatment chemistry molecule 311 to exposed metals, metal oxides, or interlayer dielectric materials of back surface 205 of substrate wafer 201.

During back surface exposure during bonding operation 312, the bond between head groups 504, 514 and constituent group 508 are cleaved and head groups 504, 514 bond to the oxygen constituent 302 of back surface 205 of substrate wafer 201 to form backside wafer treatment layer 202, which may be a monolayer having any thickness discussed herein with respect to FIG. 3. As shown in the close up view toward the bottom of FIG. 5, molecules 501 are attached to back surface 205 of substrate wafer 201. In some embodiments, an IC device includes device layer 203 adjacent to front surface 204 of IC die 206, and backside wafer treatment layer 202 on back surface 205 such that backside wafer treatment layer 202 includes molecules 501 chemically bonded to constituent 302 of back surface 205. In some embodiments, molecule 501 includes head groups 504 chemically bonded to constituent 302 (e.g., by an oxygen to silicon bond), and a number of terminating groups 505, 506, 507 covalently bonded to head group 504. Furthermore, molecules 501 including head groups 514 chemically bonded to constituent 302 (e.g., by an oxygen to silicon bond), and a number of terminating groups 515, 516, 517 covalently bonded to head group 514 are part of backside wafer treatment layer 202. As shown, bonding of backside wafer surface treatment chemistry molecule 511 to form molecules 501 provides a byproduct 550, which in this example is ammonia.

Figure 6:
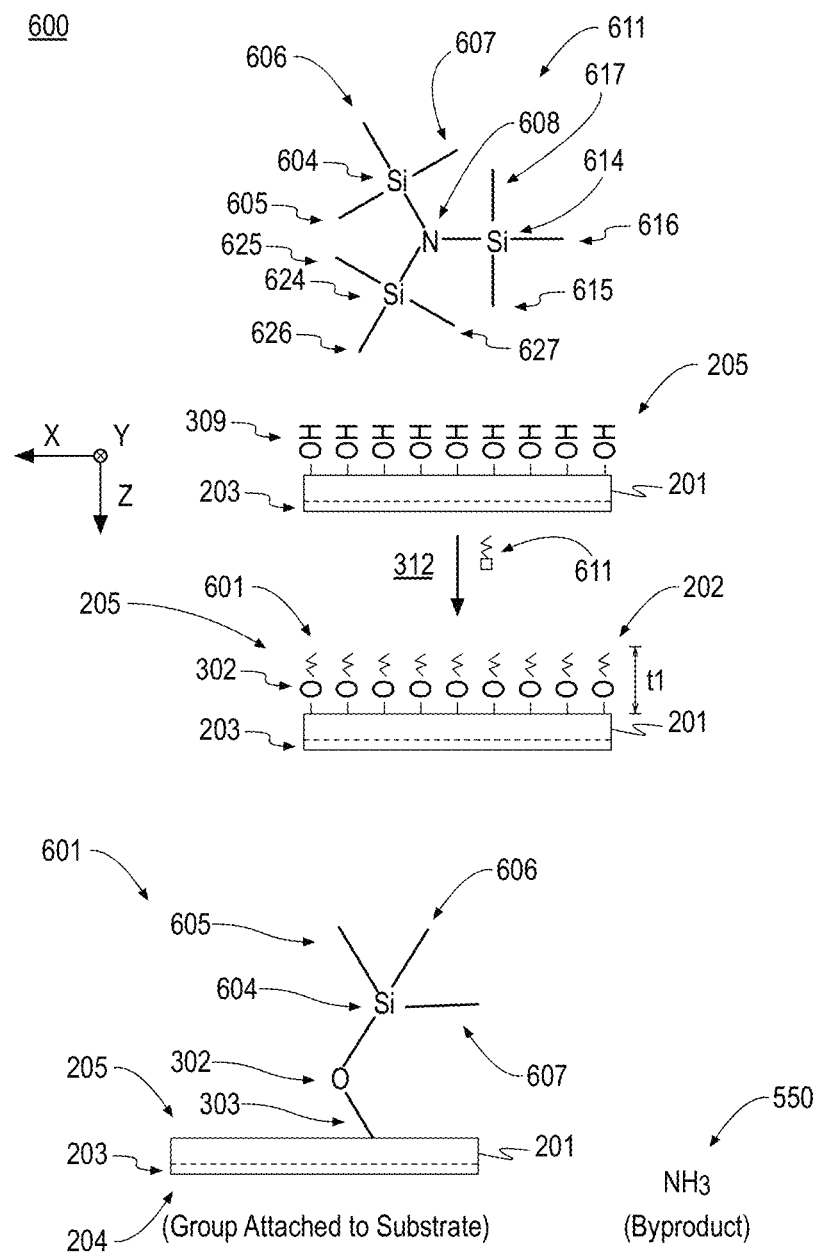
FIG. 6 illustrates an exemplary multi-head group multi-methyl terminating group backside wafer surface treatment chemistry molecular bonding to provide a backside wafer treatment layer.

FIG. 6 illustrates an exemplary multi-head group multi-methyl terminating group backside wafer surface treatment chemistry molecular bonding 600 to provide backside wafer treatment layer 202, arranged in accordance with at least some implementations of the present disclosure. As shown in FIG. 6, a backside wafer surface treatment chemistry molecule 611 includes head groups 604, 614, 624 (e.g., each a silicon atom) to bond to a backside wafer surface. Each of head groups 604, 614, 624 are covalently bonded to a nitrogen atom constituent group 608. Furthermore, head group 604 is covalently bonded to terminating groups 605, 606, 607, head group 614 is covalently bonded to terminating groups 615, 616, 617, and head group 624 is covalently bonded to terminating groups 625, 626, 627. In the example of FIG. 6, the bonds between head groups 604, 614, 624 and constituent group 608 are cleaved to expose head groups 604, 614, 624 during backside wafer surface treatment.

In the illustrated example, terminating groups 605-607, 615-617, 625-627 are methyl groups covalently bonded to head groups 604, 614, 624, respectively, by carbon to silicon bonds. However, any combination of methyl groups, vinyl groups, and phenyl groups may be used. In some embodiments, each of head groups 604, 614, 624 has one methyl group, one vinyl group, and one phenyl group. In some embodiments, head group 604 has three methyl group, head group 614 has three vinyl groups, and head group 624 has three phenyl groups. Other combinations are available.

As shown with respect to bonding operation 312, backside wafer surface treatment chemistry molecules 611 are exposed to back surface 205 of substrate wafer 201. In some embodiments, back surface 205 of substrate wafer 201 has exposed hydroxyl groups 309.

Although illustrated with respect to silicon head groups 304 bonding to oxygen atoms of exposed hydroxyl groups 309, other head group to exposed constituent chemistries may be used to accommodate coupling backside wafer surface treatment chemistry molecule 311 to exposed metals, metal oxides, or interlayer dielectric materials of back surface 205 of substrate wafer 201.

During back surface exposure during bonding operation 312, the bond between head groups 604, 614, 624 and constituent group 608 are cleaved and head groups 604, 614, 624 bond to the oxygen constituents 302 of back surface 205 of substrate wafer 201 to form backside wafer treatment layer 202, which may be a monolayer having any thickness discussed herein with respect to FIG. 3. As shown in the close up view toward the bottom of FIG. 6, molecules 601 are attached to back surface 205 of substrate wafer 201. Although illustrated only with respect to head group 604 and terminating groups 605-607, backside wafer treatment layer 202 includes molecules 601 formed from head group 614 and terminating groups 615-617 and molecules 601 formed from head group 624 and terminating groups 625-627.

In some embodiments, an IC device includes device layer 203 adjacent to front surface 204 of IC die 206, and backside wafer treatment layer 202 on back surface 205 such that backside wafer treatment layer 202 includes molecules 501 chemically bonded to constituent 302 of back surface 205. In some embodiments, molecule 601 includes head groups 604, 614, 624 chemically bonded to constituents 302 (e.g., by an oxygen to silicon bond), and a number of terminating groups 605-607, 615-617, 625-627 covalently bonded to head groups 604, 614, 624, respectively. As shown, bonding of backside wafer surface treatment chemistry molecules 611 to form molecules 601 provides a byproduct 550, which in this example is ammonia.

Figure 7:
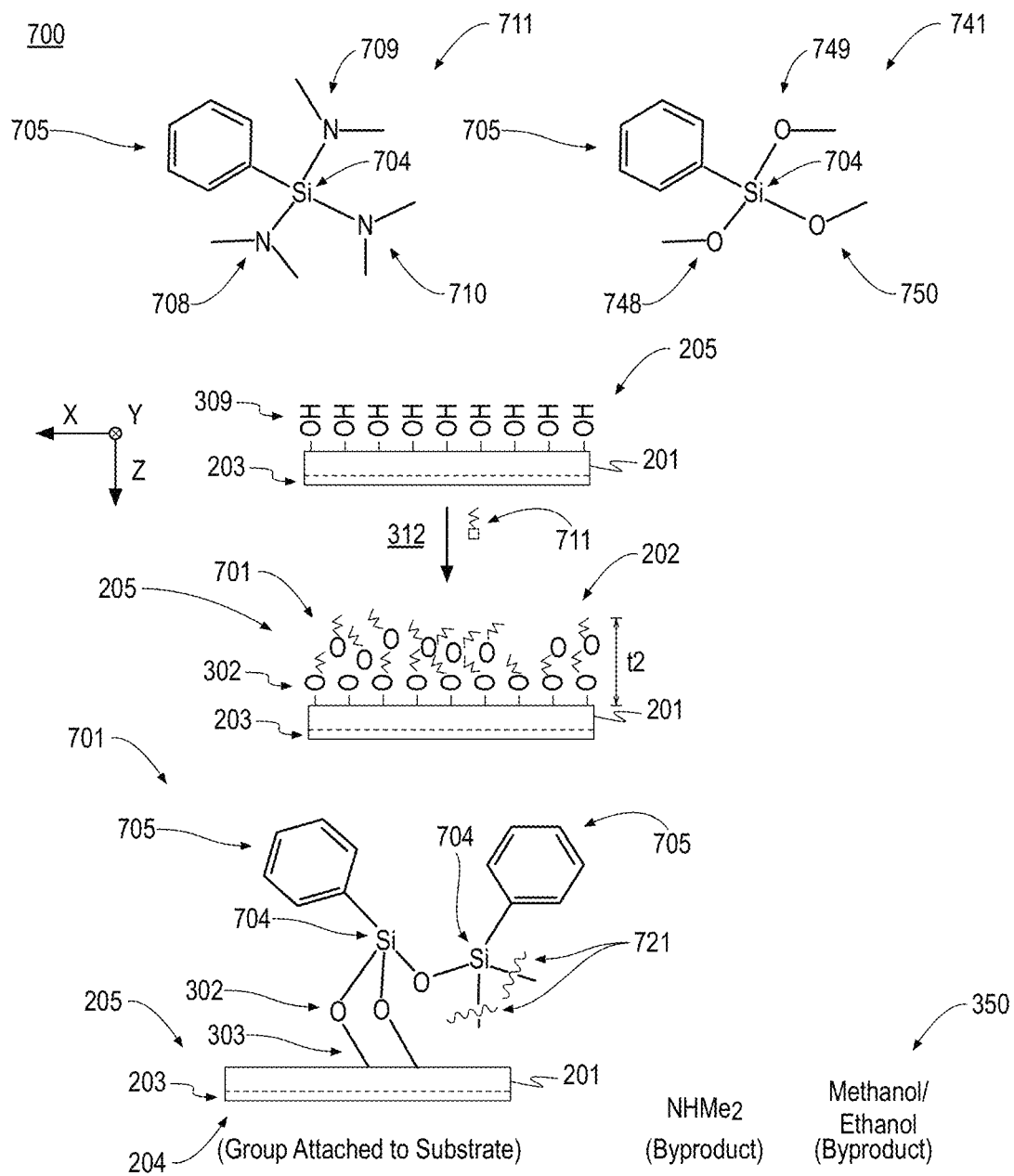
FIG. 7 illustrates an exemplary phenyl terminating group backside wafer surface treatment chemistry molecular bonding to provide a multi-layer backside wafer treatment layer.

FIG. 7 illustrates an exemplary phenyl terminating group backside wafer surface treatment chemistry molecular bonding 700 to provide a multi-layer backside wafer treatment layer 202, arranged in accordance with at least some implementations of the present disclosure. As shown, a backside wafer surface treatment chemistry molecule 711 includes a head group 704 (e.g., a silicon atom) to bond to a backside wafer surface. Head group 704 is covalently bonded to multiple constituent groups 708, 709, 710. In some embodiments, each constituent group 708, 709, 710 is a dimethylamine group, as discussed herein. Backside wafer surface treatment chemistry molecule 711 further includes a terminating group 705 covalently bonded to head group 704. In some embodiments, terminating group 705 is a phenyl group covalently bonded to head group 704 by a carbon to silicon bond. In some embodiments, as shown, backside wafer surface treatment chemistry molecule 711 is Tris(dimethylamino)phenylsilane. Alternatively, a backside wafer surface treatment chemistry molecule 741 includes head group 704 covalently bonded to constituent groups 748, 749, 750. In the example of backside wafer surface treatment chemistry molecule 741, constituent groups 748, 749, 750 are methoxy groups although one or more of constituent groups 748, 749, 750 may be ethoxy groups.

Although illustrated with respect to one phenyl terminating group 705 and three constituent groups 708, 709, 710, 748, 749, 750, backside wafer surface treatment chemistry molecule 711, 741 may include two phenyl terminating groups and two dimethylamine or methoxy/ethoxy constituent groups or three phenyl terminating groups and one dimethylamine or methoxy/ethoxy constituent group. As shown with respect to bonding operation 312, backside wafer surface treatment chemistry molecules 711 or backside wafer surface treatment chemistry molecules 741 are exposed to back surface 205 of substrate wafer 201. In some embodiments, back surface 205 of substrate wafer 201 has exposed hydroxyl groups 309. Although illustrated with respect to silicon head groups 704 bonding to oxygen atoms of exposed hydroxyl groups 309, other head group to exposed constituent chemistries may be used to accommodate coupling backside wafer surface treatment chemistry molecule 711, 741 to exposed metals, metal oxides, or interlayer dielectric materials of back surface 205 of substrate wafer 201.

During back surface exposure during bonding operation 312, the bond between head group 704 and one or more of constituent groups 708, 709, 710 or one or more of constituent groups 748, 749, 750 is cleaved and head group 704 bonds to the oxygen of exposed hydroxyl groups 309. Head group 704 may bond to a single oxygen atoms or to two or three oxygen atoms of back surface 205 (with two being illustrated). Furthermore, oxygen atoms in the reaction environment may bond to head group and cross link to other backside wafer surface treatment chemistry molecules 711, 741 as shown with respect to cross links 721. Such cross linking is effectively self terminating to form a limited multilayer having thickness t2 including any dimensions discussed herein with respect to FIG. 4.

As shown in the close up view toward the bottom of FIG. 7, molecules 701 are attached to back surface 205 of substrate wafer 201. In some embodiments, an IC device includes device layer 203 adjacent to front surface 204 of IC die 206, and backside wafer treatment layer 202 on back surface 205 such that backside wafer treatment layer 202 includes molecules 701 chemically bonded to constituents 302 of back surface 205. In some embodiments, molecules 701 include head group 704 chemically bonded to constituent 302 (e.g., by an oxygen to silicon bond), and a terminating group 705 covalently bonded to head group 704. In the example of FIG. 7, terminating group 705 is a phenyl group. As shown, bonding of backside wafer surface treatment chemistry molecule 711 to form molecules 701 provides byproduct 350.

Figure 8:
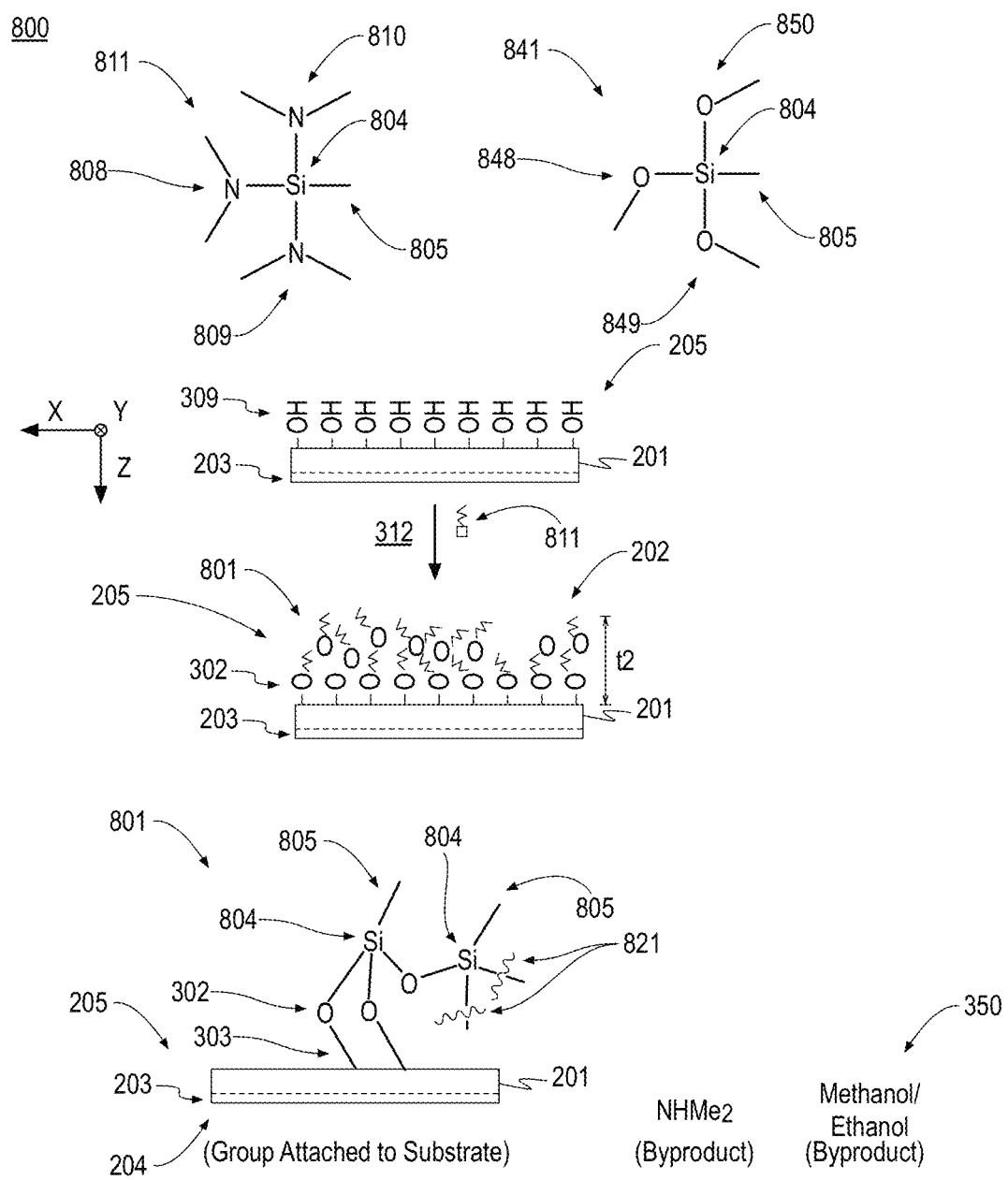
FIG. 8 illustrates an exemplary methyl terminating group backside wafer surface treatment chemistry molecular bonding to provide a multi-layer backside wafer treatment layer.

FIG. 8 illustrates an exemplary methyl terminating group backside wafer surface treatment chemistry molecular bonding 800 to provide a multi-layer backside wafer treatment layer 202, arranged in accordance with at least some implementations of the present disclosure. As shown, a backside wafer surface treatment chemistry molecule 811 includes a head group 804 (e.g., a silicon atom) to bond to a backside wafer surface. Head group 804 is covalently bonded to multiple constituent groups 808, 809, 810. In some embodiments, each constituent group 808, 809, 810 is a dimethylamine group, as discussed herein. Backside wafer surface treatment chemistry molecule 811 further includes a terminating group 805 covalently bonded to head group 804. In some embodiments, terminating group 805 is a methyl group covalently bonded to head group 804 by a carbon to silicon bond. In some embodiments, as shown, backside wafer surface treatment chemistry molecule 811 is Tris (dimethylamino)methylsilane. Alternatively, a backside wafer surface treatment chemistry molecule 841 includes head group 704 covalently bonded to constituent groups 848, 849, 850. In the example of backside wafer surface treatment chemistry molecule 841, constituent groups 848, 849, 850 are methoxy groups although one or more of constituent groups 848, 849, 850 may be ethoxy groups.

Although illustrated with respect to one methyl terminating group 805 and three constituent groups 708, 709, 710, 748, 749, 750, backside wafer surface treatment chemistry molecule 811, 841 may include two methyl terminating groups and two dimethylamine or methoxy/ethoxy constituent groups or three methyl terminating groups and one dimethylamine or methoxy/ethoxy constituent group. As shown with respect to bonding operation 312, backside wafer surface treatment chemistry molecules 811 or backside wafer surface treatment chemistry molecules 841 are exposed to back surface 205 of substrate wafer 201. In some embodiments, back surface 205 of substrate wafer 201 has exposed hydroxyl groups 309. Although illustrated with respect to silicon head groups 804 bonding to oxygen atoms of exposed hydroxyl groups 309, other head group to exposed constituent chemistries may be used to accommodate coupling backside wafer surface treatment chemistry molecule 811, 841 to exposed metals, metal oxides, or interlayer dielectric materials of back surface 205 of substrate wafer 201.

During back surface exposure during bonding operation 312, the bond between head group 804 and one or more of constituent groups 808, 809, 810 or one or more of constituent groups 848, 849, 850 is cleaved and head group 804 bonds to the oxygen of exposed hydroxyl groups 309. Head group 804 may bond to a single oxygen atoms or to two or three oxygen atoms of back surface 205 (with two being illustrated). Furthermore, oxygen atoms in the reaction environment may bond to head group and cross link to other backside wafer surface treatment chemistry molecules 811, 841 as shown with respect to cross links 821. Such cross linking is effectively self terminating to form a limited multilayer having thickness t2 including any dimensions discussed herein.

As shown in the close up view toward the bottom of FIG. 8, molecules 801 are attached to back surface 205 of substrate wafer 201. In some embodiments, an IC device includes device layer 203 adjacent to front surface 204 of IC die 206, and backside wafer treatment layer 202 on back surface 205 such that backside wafer treatment layer 202 includes molecules 801 chemically bonded to constituents 302 of back surface 205. In some embodiments, molecules 801 include head group 804 chemically bonded to constituent 302 (e.g., by an oxygen to silicon bond), and a terminating group 805 covalently bonded to head group 704. In the example of FIG. 8, terminating group 705 is a methyl group. As shown, bonding of backside wafer surface treatment chemistry molecule 811 to form molecules 801 provides a byproduct 350, which in this example is dimethylamine.

Figure 9:
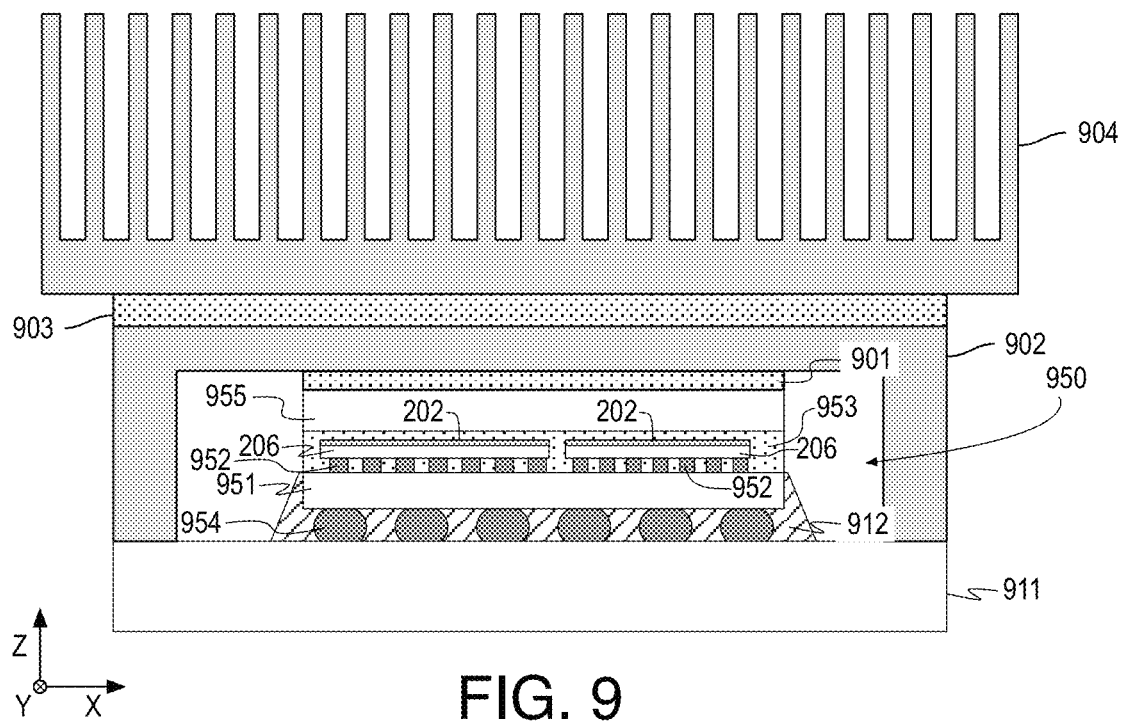
FIG. 9 illustrates an example microelectronic device assembly including an integrated circuit die having a backside wafer treatment layer.

FIG. 9 illustrates an example microelectronic device assembly 900 including IC die 206 having backside wafer treatment layer 202, in accordance with some embodiments. As shown in FIG. 9, microelectronic device assembly 900 may include a multichip composite device 950 is represented. However, any single IC die, 3D stacked multichip device, or the like may be deployed in microelectronic device assembly 900. Multichip composite device 950 includes any number of IC dies 206 having corresponding backside wafer treatment layers 202 mounted to a base die 951 by die level interconnects 952. IC dies 206 are embedded in inorganic dielectric material 953, which may be, for example, silicon dioxide. A handle die 955 or structural die may be on inorganic dielectric material 953. Base die 951 is coupled to a substrate 911 via interconnects 954.

As discussed, microelectronic device assembly 900 includes base die 951 attached to substrate 911 via interconnects 954, and an optional underfill 912. Microelectronic device assembly 900 may include a power supply (not shown) coupled to one or more of base die 951, IC dies 206, or other components of microelectronic device assembly 900. The power supply may include a battery, voltage converter, power supply circuitry, or the like. Microelectronic device assembly 900 further includes a thermal interface material (TIM) 901 disposed on a top surface of handle die 955. TIM 901 may include any suitable thermal interface material and may be characterized as TIM 1. Integrated heat spreader 902 having a surface on TIM 901 extends over multichip composite device 950, and is mounted to substrate 911. Substrate 911 may include any suitable substrate such as a package substrate, motherboard, interposer, or the like. In addition or in the alternative, substrate 911 may be mounted to a motherboard. Microelectronic device assembly 900 further includes TIM 903 disposed on a top surface of integrated heat spreader 902. TIM 903 may include any suitable thermal interface material and may be characterized as TIM 2. TIM 901 and TIM 903 may be the same materials or they may be different. Heat sink 904 (e.g., an exemplary heat dissipation device or thermal solution) is on TIM 903 and dissipates heat generated multichip composite device 950. Microelectronic device assembly 900 may be used in desktop and server form factors. In other contexts, a heat solution such as a heat pipe or heat spreader may be mounted directly on TIM 901. Such assemblies may be used in smaller form factor devices. Other heat dissipation devices may be used.

Figure 10:
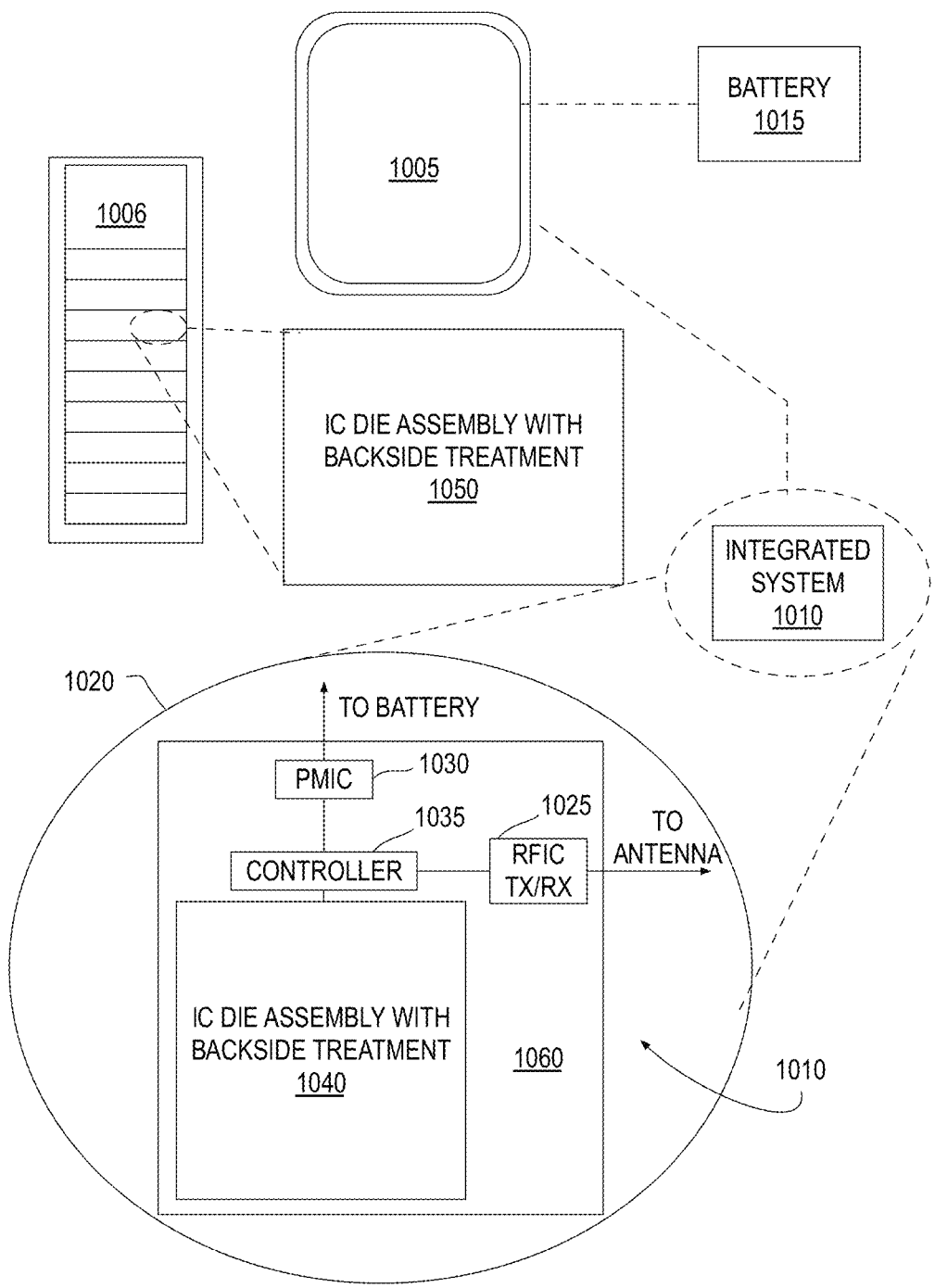
FIG. 10 illustrates exemplary systems employing an integrated circuit die including a backside wafer treatment layer.

FIG. 10 illustrates exemplary systems employing an IC die including a backside wafer treatment layer, in accordance with some embodiments. The system may be a mobile computing platform 1005 and/or a data server machine 1006, for example. Either may employ a component assembly including a backside wafer treatment layer as described elsewhere herein. Server machine 1006 may be any commercial server, for example, including any number of high-performance computing platforms disposed within a rack and networked together for electronic data processing, which in the exemplary embodiment includes an IC die assembly 1050 with a backside wafer treatment layer as described elsewhere herein. Mobile computing platform 1005 may be any portable device configured for each of electronic data display, electronic data processing, wireless electronic data transmission, or the like. For example, mobile computing platform 1005 may be any of a tablet, a smart phone, a laptop computer, etc., and may include a display screen (e.g., a capacitive, inductive, resistive, or optical touchscreen), a chip-level or package-level integrated system 1010, and a battery 1015. Although illustrated with respect to mobile computing platform 1005, in other examples, chip-level or package-level integrated system 1010 and a battery 1015 may be implemented in a desktop computing platform, an automotive computing platform, an internet of things platform, or the like. As discussed below, in some examples, the disclosed systems may include a sub-system 1060 such as a system on a chip (SOC) or an integrated system of multiple ICs, which is illustrated with respect to mobile computing platform 1005.

Whether disposed within integrated system 1010 illustrated in expanded view 1020 or as a stand-alone packaged device within data server machine 1006, sub-system 1060 may include memory circuitry and/or processor circuitry 1040 (e.g., RAM, a microprocessor, a multi-core microprocessor, graphics processor, etc.), a power management integrated circuit (PMIC) 1030, a controller 1035, and a radio frequency integrated circuit (RFIC) 1025 (e.g., including a wideband RF transmitter and/or receiver (TX/RX)). As shown, one or more IC dice, such as memory circuitry and/or processor circuitry 1040 may be assembled and implemented such that one or more have a backside wafer treatment layer as described herein. In some embodiments, RFIC 1025 includes a digital baseband and an analog front end module further comprising a power amplifier on a transmit path and a low noise amplifier on a receive path). Functionally, PMIC 1030 may perform battery power regulation, DC-to-DC conversion, etc., and so has an input coupled to battery 1015, and an output providing a current supply to other functional modules. As further illustrated in FIG. 10, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 1040 may provide memory functionality for sub-system 1060, high level control, data processing and the like for sub-system 1060. In alternative implementations, each of the SOC modules may be integrated onto separate ICs coupled to a package substrate, interposer, or board.

Figure 11:
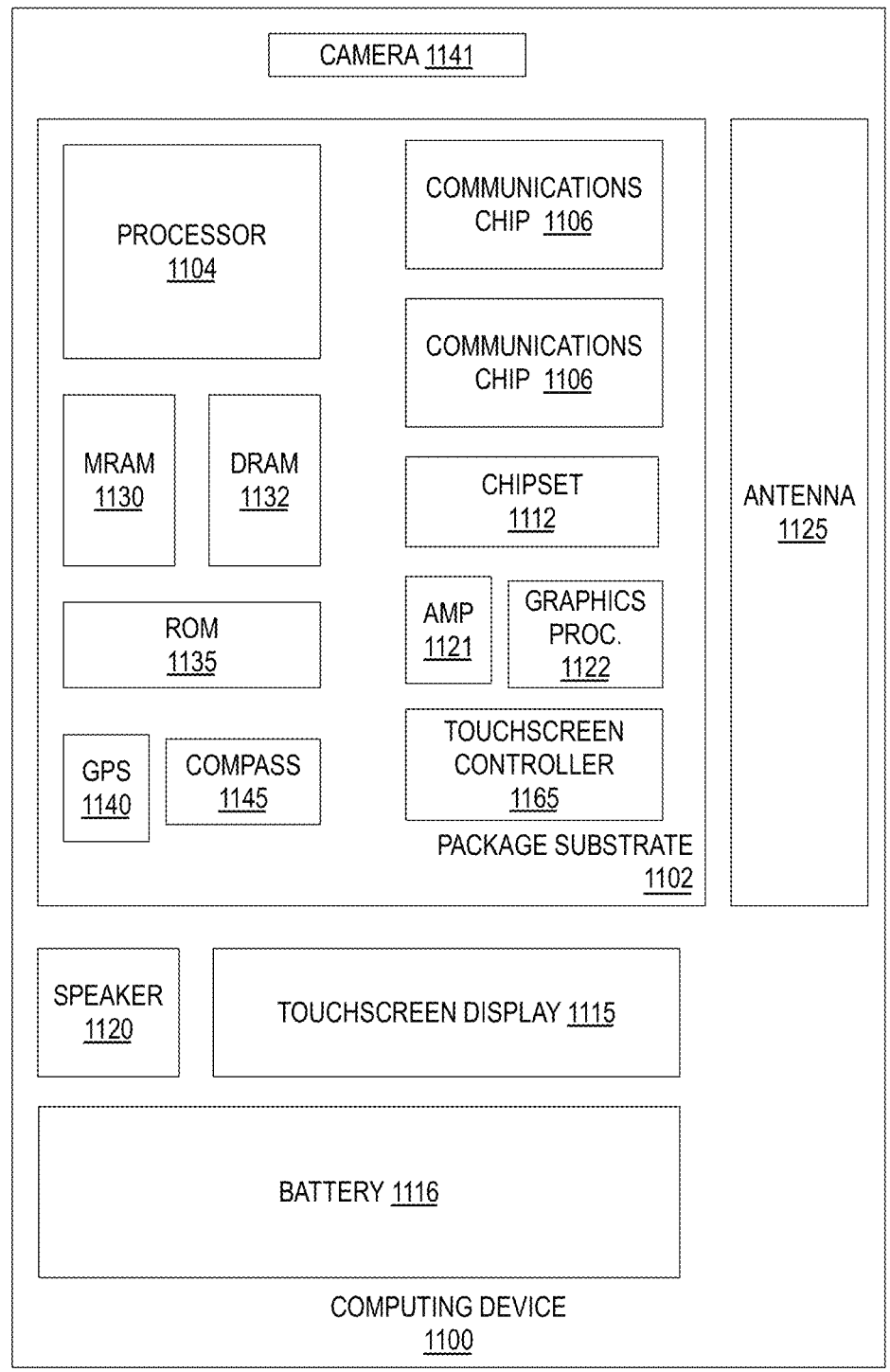
FIG. 11 is a functional block diagram of an electronic computing device.

FIG. 11 is a functional block diagram of an electronic computing device 1100, in accordance with some embodiments. For example, device 1100 may, via any suitable component therein, employ a backside wafer treatment layer in accordance with any embodiments described elsewhere herein. Device 1100 further includes a motherboard or package substrate 1102 hosting a number of components, such as, but not limited to, a processor 1104 (e.g., an applications processor). Processor 1104 may be physically and/or electrically coupled to package substrate 1102. In some examples, processor 1104 is within an IC assembly that includes a backside wafer treatment layer as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the package substrate 1102. In further implementations, communication chips 1106 may be part of processor 1104. Depending on its applications, computing device 1100 may include other components that may or may not be physically and electrically coupled to package substrate 1102. These other components include, but are not limited to, volatile memory (e.g., DRAM 1132), non-volatile memory (e.g., ROM 1135), flash memory (e.g., NAND or NOR), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth, or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including, but not limited to, those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

The following pertain to exemplary embodiments.

In one or more first embodiments, an integrated circuit device comprises a device layer adjacent to a front surface of an integrated circuit (IC) die, and a layer on a back surface of the IC die opposite the front surface, wherein the layer comprises a molecule chemically bonded to a constituent of the back surface of the IC die, the molecule comprising a head group chemically bonded to the first constituent and one or more terminating groups covalently bonded to the head group, the one or more terminating groups comprising a vinyl group, a phenyl group, or a group comprising at least three molecular units.

In one or more second embodiments, further to the first embodiments, the head group comprises a silicon atom covalently bonded to an oxygen atom of the constituent.

In one or more third embodiments, further to the first or second embodiments, the molecule comprises two or more vinyl terminating groups each covalently bonded to the head group.

In one or more fourth embodiments, further to the first through third embodiments, the molecule comprises a vinyl terminating group and one or more methyl terminating groups each covalently bonded to the head group.

In one or more fifth embodiments, further to the first through fourth embodiments, the molecule comprises the group comprising at least three molecular units, wherein the group comprises not more than ten molecular units, the molecular units comprising carbon, hydrogen, nitrogen, or oxygen.

In one or more sixth embodiments, further to the first through fifth embodiments, the layer is on a first region of the back surface of the IC die, the back surface comprising a second region absent the layer.

In one or more seventh embodiments, an integrated circuit device comprises a device layer adjacent to a front surface of an integrated circuit (IC) die, and a multilayer on a back surface of the IC die opposite the front surface, wherein the multilayer comprises a first molecule chemically bonded to a first constituent of the back surface of the IC die, the first molecule comprising a first head group chemically bonded to the first constituent, and a first terminating group covalently bonded to the head group and a second molecule chemically bonded to the first head group, the second molecule comprising a second head group chemically bonded to the first head group, and a second terminating group covalently bonded to the head group, wherein the first and second head groups comprise the same head group chemistry and the first and second terminating groups comprise the same terminating group chemistry.

In one or more eighth embodiments, further to the seventh embodiments, the first head group comprises a silicon atom covalently bonded to an oxygen atom of the first constituent, and the second head group comprises a silicon atom and an oxygen atom covalently bonded to the silicon atom of the first head group and the silicon atom of the second head group.

In one or more ninth embodiments, further to the seventh or eighth embodiments, the first and second terminating groups each comprise a vinyl group.

In one or more tenth embodiments, further to the seventh through ninth embodiments, the first and second terminating groups each comprise a phenyl group.

In one or more eleventh embodiments, further to the seventh through tenth embodiments, the first and second terminating groups each comprise a methyl group.

In one or more twelfth embodiments, further to the seventh through eleventh embodiments, the first and second terminating groups each comprise three to ten molecular units, the molecular units comprising carbon, hydrogen, nitrogen, or oxygen.

In one or more thirteenth embodiments, further to the seventh through twelfth embodiments, the multilayer is on a first region of the back surface of the IC die, the back surface comprising a second region absent the multilayer.

In one or more fourteenth embodiments, a system comprises an IC device according to any of the first through thirteenth embodiments, the IC device coupled to a power supply.

In one or more fifteenth embodiments, a pre-chucking backside wafer surface treatment comprises a molecule comprising a head group to bond to the wafer surface, the head group comprising silicon covalently bonded to a constituent group comprising nitrogen or oxygen by a silicon to nitrogen or oxygen bond and a terminating group covalently bonded to the head group by a carbon to silicon bond, the terminating group comprising one of a vinyl group, a phenyl group, or a group comprising at least three molecular units.

In one or more sixteenth embodiments, further to the fifteenth embodiments, the molecule comprises two or more vinyl terminating groups each covalently bonded to the head group.

In one or more seventeenth embodiments, further to the fifteenth or sixteenth embodiments, the molecule comprises a vinyl terminating group and two or more constituent groups comprising nitrogen bonded to the head group by silicon to nitrogen bonds.

In one or more eighteenth embodiments, further to the fifteenth through seventeenth embodiments, the molecule comprises a second head group comprising silicon covalently bonded to the constituent group by a silicon to nitrogen bond, and a second terminating group covalently bonded to the second head group by a carbon to silicon bond.

In one or more nineteenth embodiments, further to the fifteenth through eighteenth embodiments, the terminating group and the second terminating group each comprise a vinyl group.

In one or more twentieth embodiments, further to the fifteenth through nineteenth embodiments, the terminating group comprises a phenyl group, and the molecule comprises two or more constituent groups comprising nitrogen bonded to the head group by silicon to nitrogen bonds.

In one or more twenty-first embodiments, further to the fifteenth through twentieth embodiments, the molecule comprises the group comprising at least three molecular units, wherein the group comprises not more than ten molecular units, the molecular units comprising carbon, hydrogen, nitrogen, or oxygen.

In one or more twenty-second embodiments, further to the fifteenth through twenty-first embodiments, the molecule comprises one of 1,1,1-Triethenyl-N,N-dimethylsilanamine, Tris(N,N-dimethylamino)vinyl silane, 1,3-divinyl-1,1,3,3-tetramethyldisilazane, or Tris(dimethylamino)phenylsilane.

In one or more twenty-third embodiments, a pre-chucking backside wafer surface treatment comprises a head group comprising silicon covalently bonded to a constituent group comprising nitrogen by a silicon to nitrogen bond and a terminating methyl group covalently bonded to the head group by a carbon to silicon bond, wherein the nitrogen of the constituent group is further covalently bonded to two additional head groups comprising silicon or two additional methyl groups.

In one or more twenty-fourth embodiments, further to the twenty-third embodiments, the nitrogen of the constituent group is further covalently bonded to two additional head groups comprising silicon, one or more of the head groups covalently to one or more methyl groups.

In one or more twenty-fifth embodiments, further to the twenty-third or twenty-fourth embodiments, at least one of the head groups is covalently bonded to three methyl groups.

In one or more twenty-sixth embodiments, further to the twenty-third through twenty-fifth embodiments, the molecule comprises one of Tris(trimethylsilyl)amine or Tris(dimethylamino)methylsilane.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An integrated circuit device, comprising:
 a device layer adjacent to a front surface of an integrated circuit (IC) die; and
 a layer on a back surface of the IC die opposite the front surface, wherein the layer comprises a molecule chemi- cally bonded to a constituent of the back surface of the IC die, the molecule comprising:
 a head group chemically bonded to the constituent; and
 one or more terminating groups covalently bonded to the head group, the one or more terminating groups comprising a vinyl group, a phenyl group, or a group comprising at least three molecular units.

2. The integrated circuit device of claim 1, wherein the head group comprises a silicon atom covalently bonded to an oxygen atom of the constituent.

3. The integrated circuit device of claim 2, wherein the molecule comprises two or more vinyl terminating groups each covalently bonded to the head group.

4. The integrated circuit device of claim 2, wherein the molecule comprises a vinyl terminating group and one or more methyl terminating groups each covalently bonded to the head group.

5. The integrated circuit device of claim 1, wherein the molecule comprises the group comprising at least three molecular units, wherein the group comprises not more than ten molecular units, the molecular units comprising carbon, hydrogen, nitrogen, or oxygen.

6. The integrated circuit device of claim 1, wherein the layer is on a first region of the back surface of the IC die, the back surface comprising a second region absent the layer.

7. An integrated circuit device, comprising:
 a device layer adjacent to a front surface of an integrated circuit (IC) die; and
 a multilayer on a back surface of the IC die opposite the front surface, wherein the multilayer comprises:
  a first molecule chemically bonded to a constituent of the back surface of the IC die, the first molecule comprising a first head group chemically bonded to the constituent, and a first terminating group covalently bonded to the first head group; and
  a second molecule chemically bonded to the first head group, the second molecule comprising a second head group chemically bonded to the first head group, and a second terminating group covalently bonded to the second head group, wherein the first and second head groups comprise the same head group chemistry and the first and second terminating groups comprise the same terminating group chemistry.

8. The integrated circuit device of claim 7, wherein the first head group comprises a silicon atom covalently bonded to an oxygen atom of the constituent, and the second head group comprises a silicon atom and an oxygen atom covalently bonded to the silicon atom of the first head group and the silicon atom of the second head group.

9. The integrated circuit device of claim 8, wherein the first and second terminating groups each comprise a vinyl group.

10. The integrated circuit device of claim 8, wherein the first and second terminating groups each comprise a phenyl group.

11. The integrated circuit device of claim 8, wherein the first and second terminating groups each comprise a methyl group.

12. The integrated circuit device of claim 8, wherein the first and second terminating groups each comprise three to ten molecular units, the molecular units comprising carbon, hydrogen, nitrogen, or oxygen.

13. The integrated circuit device of claim 7, wherein the multilayer is on a first region of the back surface of the IC die, the back surface comprising a second region absent the multilayer.

14. A pre-chucking backside wafer surface treatment, comprising:
 a molecule comprising:
  a head group to bond to the wafer surface, the head group comprising silicon covalently bonded to a constituent group comprising nitrogen or oxygen by a silicon to nitrogen or oxygen bond; and
  a terminating group covalently bonded to the head group by a carbon to silicon bond, the terminating group comprising one of a vinyl group, a phenyl group, or a group comprising at least three molecular units.

15. The wafer surface treatment of claim 14, wherein the molecule comprises two or more vinyl terminating groups each covalently bonded to the head group.

16. The wafer surface treatment of claim 14, wherein the molecule comprises a vinyl terminating group and two or more constituent groups comprising nitrogen bonded to the head group by silicon to nitrogen bonds.

17. The wafer surface treatment of claim 14, wherein the molecule comprises a second head group comprising silicon covalently bonded to the constituent group by a silicon to nitrogen bond, and a second terminating group covalently bonded to the second head group by a carbon to silicon bond.

18. The wafer surface treatment of claim 17, wherein the terminating group and the second terminating group each comprise a vinyl group.

19. The wafer surface treatment of claim 14, wherein the terminating group comprises a phenyl group, and the molecule comprises two or more constituent groups comprising nitrogen bonded to the head group by silicon to nitrogen bonds.

20. The wafer surface treatment of claim 14, wherein the molecule comprises the group comprising at least three molecular units, wherein the group comprises not more than ten molecular units, the molecular units comprising carbon, hydrogen, nitrogen, or oxygen.

21. The wafer surface treatment of claim 14, wherein the molecule comprises one of 1,1,1-Triethenyl-N,N-dimethylsilanamine, Tris(N,N-dimethylamino)vinyl silane, 1,3-divinyl-1,1,3,3-tetramethyldisilazane, or Tris(dimethylamino)phenylsilane.

22. A pre-chucking backside wafer surface treatment, comprising:
 a molecule comprising:
  a head group comprising silicon covalently bonded to a constituent group comprising nitrogen by a silicon to nitrogen bond; and
  a terminating methyl group covalently bonded to the head group by a carbon to silicon bond, wherein the nitrogen of the constituent group is further covalently bonded to two additional head groups comprising silicon or two additional methyl groups.

23. The wafer surface treatment of claim 22, wherein the molecule comprises one of Tris(trimethylsilyl)amine or Tris(dimethylamino)methylsilane.

24. The wafer surface treatment of claim 22, wherein the nitrogen of the constituent group is further covalently bonded to two additional head groups comprising silicon, one or more of the head groups covalently to one or more methyl groups.

25. The wafer surface treatment of claim 24, wherein at least one of the head groups is covalently bonded to three methyl groups.

* * * * *